(12) United States Patent
Chen (10) Patent No.: US 7,190,823 B2
(45) Date of Patent: Mar. 13, 2007

(54) OVERLAY VERNIER PATTERN FOR MEASURING MULTI-LAYER OVERLAY ALIGNMENT ACCURACY AND METHOD FOR MEASURING THE SAME

(75) Inventor: Tzu-Ching Chen, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 788 days.

(21) Appl. No.: 10/063,077

(22) Filed: Mar. 17, 2002

(65) Prior Publication Data

US 2003/0174879 A1   Sep. 18, 2003

(51) Int. Cl.
*G06K 9/00* (2006.01)

(52) U.S. Cl. ............... 382/151; 257/758; 257/797; 257/E23.179; 356/400; 356/401; 382/144; 438/15; 438/401

(58) Field of Classification Search ........... 257/635, 257/797, 283, 758; 356/399, 401; 382/144, 382/151; 438/401, 975, 15
See application file for complete search history.

(56) References Cited

U.S. PATENT DOCUMENTS

| | | | | |
|---|---|---|---|---|
| 5,005,046 A | * | 4/1991 | Hashimoto | 355/77 |
| 5,322,593 A | | 6/1994 | Hasegawa et al. | |
| 5,614,767 A | * | 3/1997 | Ohara | 257/797 |
| 5,635,336 A | * | 6/1997 | Bae | 430/314 |
| 5,783,340 A | | 7/1998 | Farino et al. | |
| 5,866,447 A | * | 2/1999 | Liu | 438/229 |
| 5,912,983 A | * | 6/1999 | Hiratsuka | 382/144 |
| 5,917,205 A | * | 6/1999 | Mitsui et al. | 257/202 |
| 6,077,756 A | * | 6/2000 | Lin et al. | 438/401 |
| 6,118,517 A | | 9/2000 | Sasaki et al. | |
| 6,172,409 B1 | | 1/2001 | Zhou | |
| 6,218,200 B1 | * | 4/2001 | Chen et al. | 438/14 |
| 6,228,705 B1 | * | 5/2001 | Furukawa et al. | 438/243 |
| 6,309,944 B1 | * | 10/2001 | Sheng et al. | 438/401 |
| 6,319,791 B1 | | 11/2001 | Ando | |
| 6,362,491 B1 | * | 3/2002 | Wang et al. | 250/548 |
| 6,448,147 B2 | * | 9/2002 | Komuro | 438/401 |
| 6,716,653 B2 | * | 4/2004 | Look et al. | 438/14 |
| 6,801,313 B1 | * | 10/2004 | Yokota | 356/401 |
| 6,849,957 B2 | | 2/2005 | Takeuchi et al. | |
| 6,864,589 B2 | | 3/2005 | Ulrich | |
| 6,897,956 B2 | * | 5/2005 | Noguchi et al. | 356/401 |
| 7,008,756 B2 | | 3/2006 | Ulrich | |
| 2003/0174879 A1 | * | 9/2003 | Chen | 382/151 |
| 2005/0276465 A1 | * | 12/2005 | Chen | 382/151 |

* cited by examiner

*Primary Examiner*—Gregory Desire
(74) *Attorney, Agent, or Firm*—Winston Hsu (57) ABSTRACT

An overlay vernier pattern for measuring multi-layer overlay alignment accuracy and a method for measuring the same is provided. A distance between a first alignment mark in a first material layer and a second alignment mark in an underlying second material layer is measured, so as to provide an alignment offset between the first material layer and the second material layer. In addition, a distance between the second alignment mark in the second material layer and a third alignment mark in a third material layer underlying the second material layer is measured, so as to provide an alignment offset between the second material layer and the third material layer. Because the second alignment marks can be repeatedly used, scribe line areas for forming these alignment marks and measuring time are saved to increase the production throughput.

15 Claims, 10 Drawing Sheets

OVERLAY VERNIER PATTERN FOR MEASURING MULTI-LAYER OVERLAY ALIGNMENT ACCURACY AND METHOD FOR MEASURING THE SAME

BACKGROUND OF INVENTION

1. Field of the Invention

The present invention relates to an overlay vernier pattern and a method for measuring multi-layer overlay alignment accuracy on a substrate, and more particularly, to an overlay vernier pattern and a method that measures overlay alignment of a photoresist layer with a plurality of material layers.

2. Description of the Prior Art

Semiconductor integrated circuits undergo a variety of processing steps during manufacture, such as masking, resist coating, etching, and deposition. In many of these steps, material is overlaid or removed from the existing layer at specific locations in order to form the desired elements of the integrated circuit. Proper alignment of the various process layers is therefore critical.

Registration is typically used to measure layer-to-layer alignment accuracy for a semiconductor process. Registration involves comparing a position of a subsequent layer to a position of an existing layer by overlaying a distinct pattern on a matching pattern that is previously formed on the existing layer. At least an alignment mark is formed in the distinct pattern and the matching pattern. A distance between the alignment mark in the subsequent layer and the alignment mark in the existing layer provides a measure of misalignment between these two layers. Currently available registration structures include Box-in-Box visual verniers and Bar-in-Bar visual verniers to determine the extent of registration, i.e., the amount of alignment offset.

Figure 1:
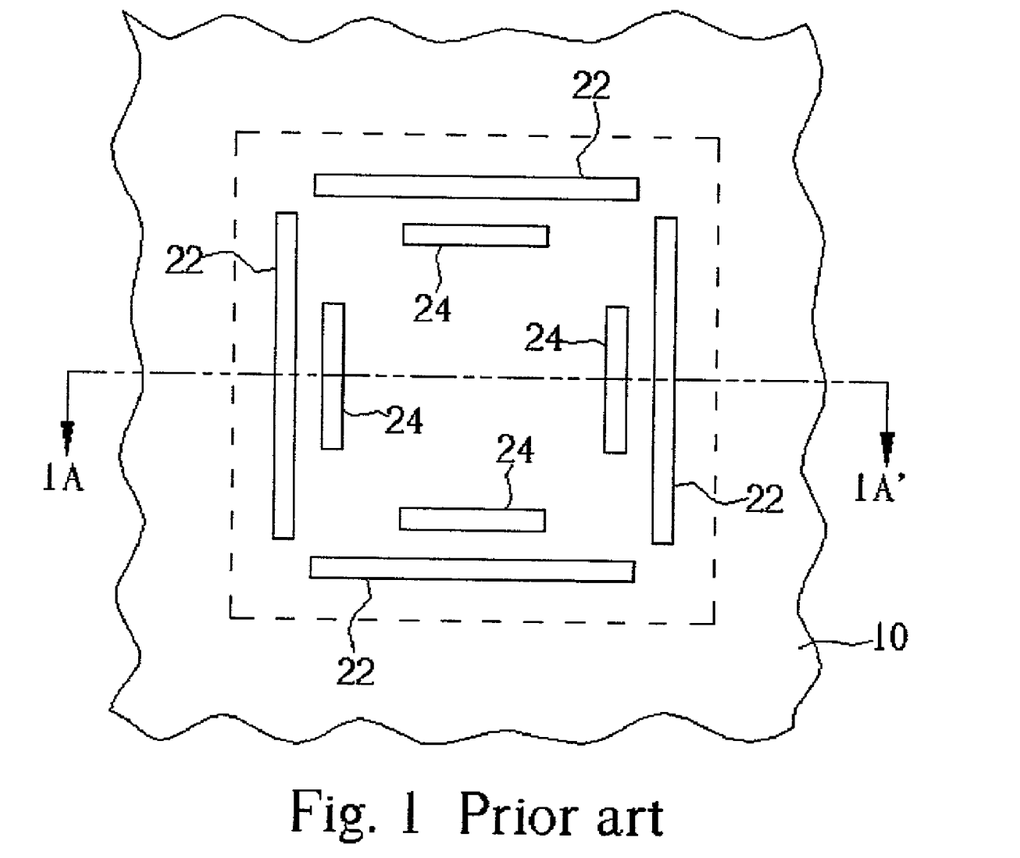
FIG. 1 shows a top view of a prior-art overlay vernier pattern for measuring layer-to-layer overlay alignment accuracy.
Figure 2:
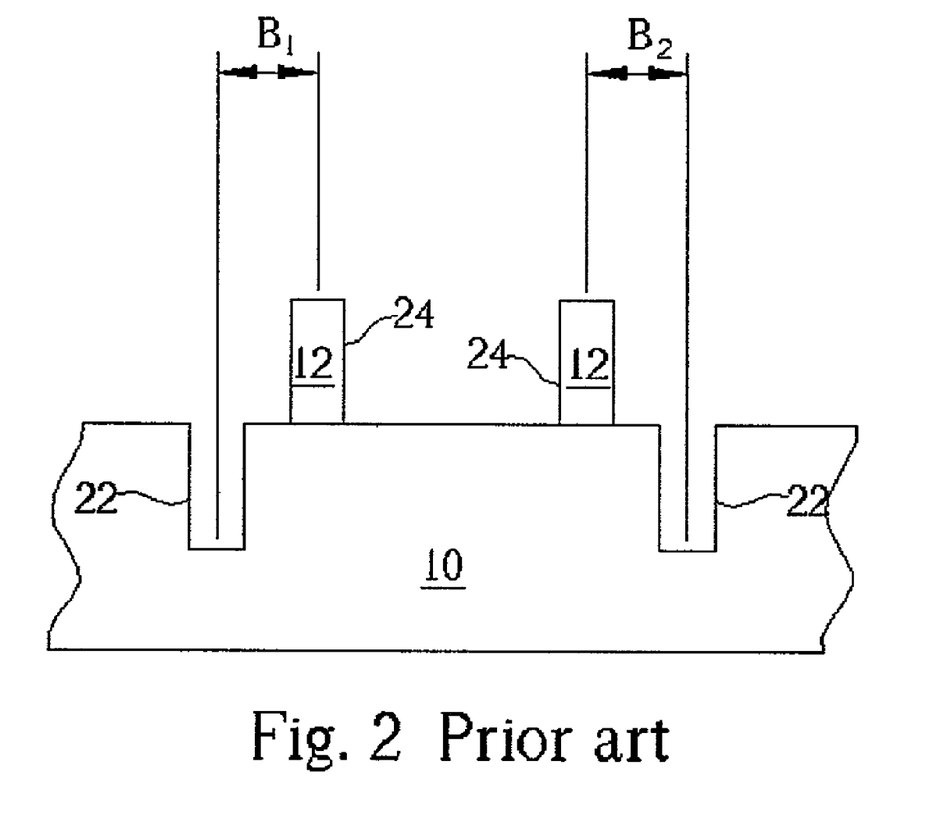
FIG. 2 shows a prior-art schematic cross-sectional view along line 1A–1A" of the top view in FIG. 1.

Please refer to FIG. 1, which shows a top view of a prior-art overlay vernier pattern for measuring layer-to-layer overlay alignment accuracy. FIG. 2 shows a prior-art schematic cross-sectional view along line 1A–1A" of the top view in FIG. 1. In FIG. 1, a typical Bar-in-Bar overlay vernier pattern 20 is shown, for example by forming a plurality of alignment marks 22 in a material layer 10 and a plurality of alignment marks 24 in another material layer 12 over the material layer 10, as depicted in the cross section in FIG. 2. The alignment marks 22 and 24 are formed in a scribe line of a test wafer and are symmetric to a center of the overlay vernier pattern 20. The material layer 10 can be a silicon substrate, a conductive layer or an insulating layer. The material layer 12 can be a conductive layer or an insulating layer. The alignment marks 22 and 24 are formed by positive photoresist or negative photoresist, having a pattern such as a recess buried in the material layers 22 and 24 or as a column protruded from an underlying material layer. Ideally, the alignment marks 22 are after-etch-inspection (AEI) trench structures formed by methods known by those versed in the art. The alignment marks 24 are after-development-inspection (ADI) photoresist column patterns.

When measuring misalignment of the material layer 12 to the material layer 10, a distance $B_1$ between a midpoint of an alignment mark 24 and a midpoint of an alignment mark 22 adjacent to the alignment mark 24 is measured using an alignment accuracy measurement tool, such as a scanning electron microscope. In addition, a distance $B_2$ between a midpoint of another alignment mark 24 and a midpoint of an alignment mark 22 adjacent to this alignment mark 24 is also measured using the same alignment accuracy measurement tool. Following this, a difference between the distances $B_1$ and $B_2$ is calculated, so as to get an alignment offset between the material layers 10 and 12. Similarly, when measuring misalignment between the material layer 12 and a material layer (not shown) over the material layer 12, another overlay vernier pattern, which includes a plurality of alignment marks in the material layer 12 and in the material layer over the material layer 12, is formed in another region of the scribe line.

However, with the shrinking dimensions of modern integrated circuits, multi-layer structure is developed for a chip. For a three-layer structure or a more complicated structure, layer-to-layer alignment accuracy measurement is performed, respectively, for any two of the layers to occupy a scribe line area and waste measuring time. Therefore, development of an overlay vernier pattern and a measurement method to effectively measure the overlay alignment accuracy of the multi-layer structure has become important.

SUMMARY OF INVENTION

It is an objective of the claimed invention to provide an overlay vernier pattern and a measurement method to effectively measure overlay alignment accuracy of a multi-layer semiconductor structure, so as to improve the production throughput.

According to the claimed invention, the overlay vernier pattern for measuring multi-layer overlay alignment accuracy comprising: a plurality of first alignment marks positioned in a first material layer; a plurality of second alignment marks positioned in a second material layer over the first material layer; and a plurality of third alignment marks positioned in a third material layer over the second material layer; wherein a distance between a first alignment mark and a third alignment mark is a measure of misalignment of the first material layer to the third material layer, and a distance between the third alignment mark and a second alignment mark is a measure of misalignment of the third material layer to the second material layer.

It is an advantage of the present invention that alignment marks in each of the material layers in a three-layer structure or a more complicated structure are overlaid in a region of the substrate. Therefore, layer-to-layer alignment accuracy measurement for any two of the material layers can be simultaneously performed in the same region, so as to save a scribe line area and measuring time to increase the throughput of the semiconductor devices.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
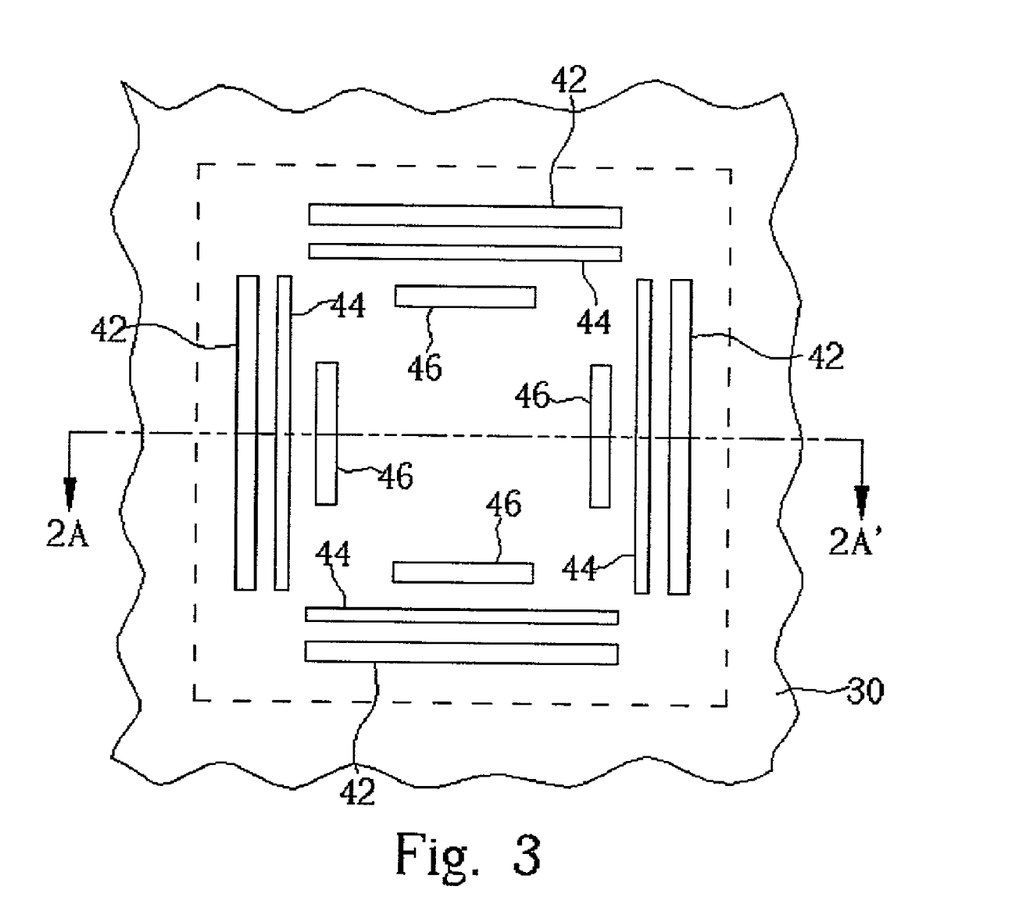
FIG. 3 shows a top view of an overlay vernier pattern for measuring multi-layer overlay alignment accuracy according to a first embodiment of the present invention.
Figure 4:
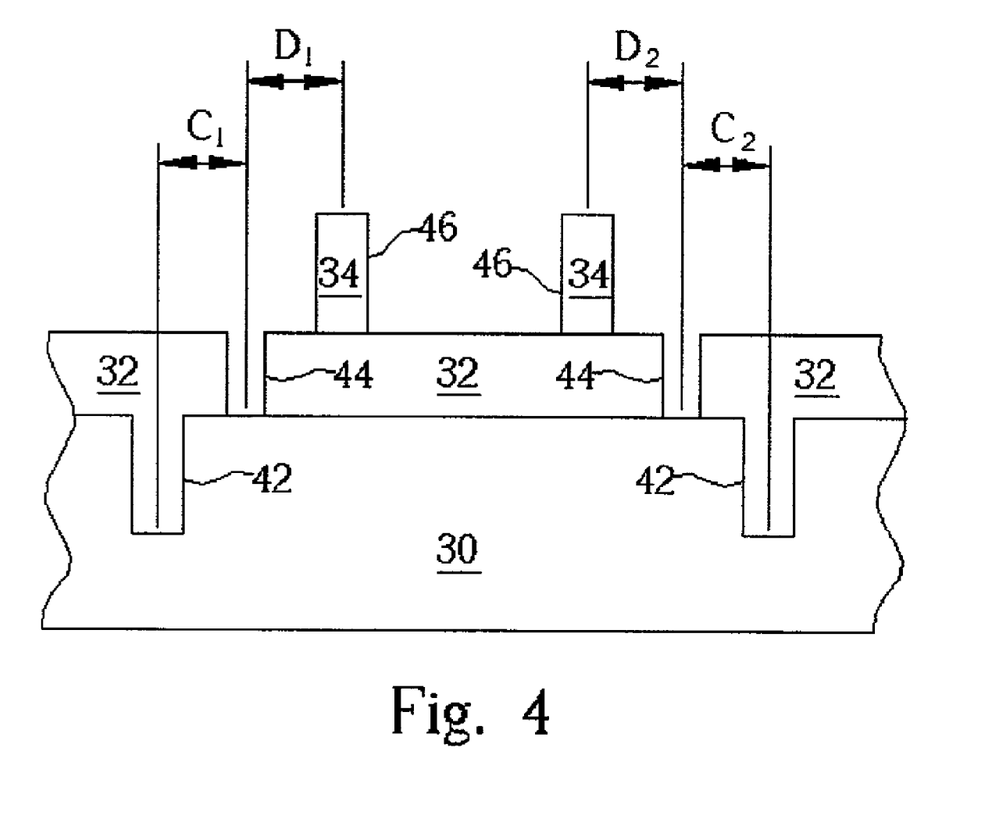
FIG. 4 shows a cross-sectional view of an overlay vernier pattern along line 2A–2A" of the top view in FIG. 3.

Please refer to FIG. 3 and FIG. 4. FIG. 3 shows a top view of an overlay vernier pattern for measuring multi-layer overlay alignment accuracy according to a first embodiment of the present invention. FIG. 4 shows a cross-sectional view of the overlay vernier pattern along line 2A–2A" of the top view in FIG. 3. In FIG. 3, a typical Bar-in-Bar overlay vernier pattern 40 is shown, for example by forming a plurality of alignment marks 42 in a material layer 30, a plurality of alignment marks 44 in a material layer 32 over the material layer 30, and a plurality of alignment marks 46 in a material layer 34 over the material layer 32, as depicted in the cross section in FIG. 4. Alternatively, a Box-in-Box overlay vernier pattern 40 is susceptible in the present invention. The alignment marks 42, 44 and 46 are formed in a scribe line of a test wafer and are symmetric to a center of the overlay vernier pattern 40. The material layer 30 can be a silicon substrate, a conductive layer or an insulating layer. The material layers 32 and 34 can be a conductive layer, such as a polysilicon layer. The alignment marks 42, 44, 46 are formed by positive photoresist or negative photoresist, having a pattern such as a recess buried in the material layers 30, 32 and 34, or as a column protruded from an underlying material layer. Ideally, the alignment marks 42 and 44 are AEI trench structures formed by methods known by those versed in the art. The alignment marks 46 are ADI photoresist column patterns.

When measuring misalignment of the material layer 32 to the material layer 30, a means consisting of an algorithm stored in a permanent memory is provided to measure a distance $C_1$ between a midpoint of an alignment mark 42 and a midpoint of an alignment mark 44 adjacent to the alignment mark 42. A distance $C_2$ between a midpoint of another alignment mark 42 and a midpoint of an alignment mark 44 adjacent to this alignment mark 42 is also measured. Following this, the distances $C_1$ and $C_2$ are compared to each other, and a difference between the distances $C_1$ and $C_2$ is calculated, so as to get an alignment offset between the material layers 30 and 32.

Similarly, when measuring misalignment of the material layer 32 to the material layer 34, the same algorithm stored in the permanent memory is provided to measure a distance $D_1$ between a midpoint of an alignment mark 44 and a midpoint of an alignment mark 46 adjacent to the alignment mark 44. A distance $D_2$ between a midpoint of another alignment mark 44 and a midpoint of an alignment mark 46 adjacent to this alignment mark 44 is also measured. Following this, the distances $D_1$ and $D_2$ are compared to each other, and a difference between the distances $D_1$ and $D_2$ is calculated, so as to get an alignment offset between the material layers 32 and 34.

According to the present invention, the alignment verniers for measuring the alignment accuracy between the material layer 30 and 32, and the alignment verniers for measuring the alignment accuracy between the material layer 32 and 34, can be formed in the same region of the scribe line. Specifically, the alignment marks 44 can be repeatedly used when measuring the alignment accuracy between the material layers 30 and 32, and measuring the alignment accuracy between the material layers 32 and 34. Therefore, problems as waste of scribe line area and measuring time as happened in the prior art are effectively prevented in the present invention.

Figure 5:
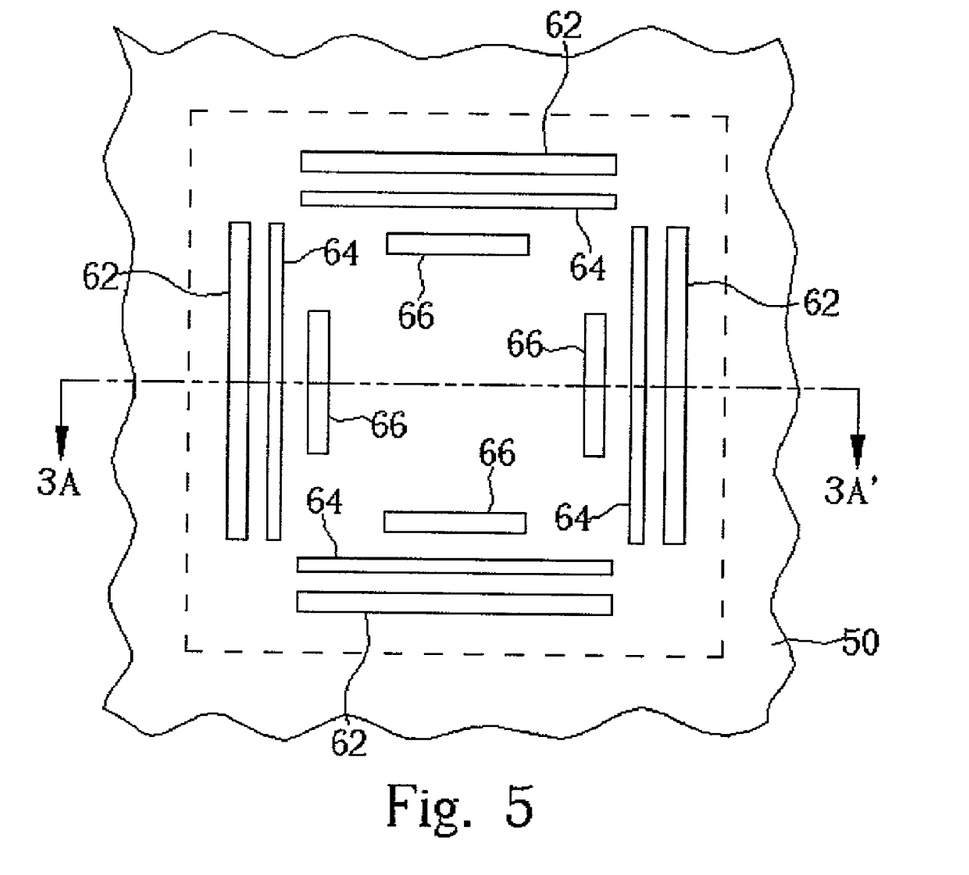
FIG. 5 shows a top view of an overlay vernier pattern for measuring multi-layer overlay alignment accuracy according to a second embodiment of the present invention.
Figure 6:
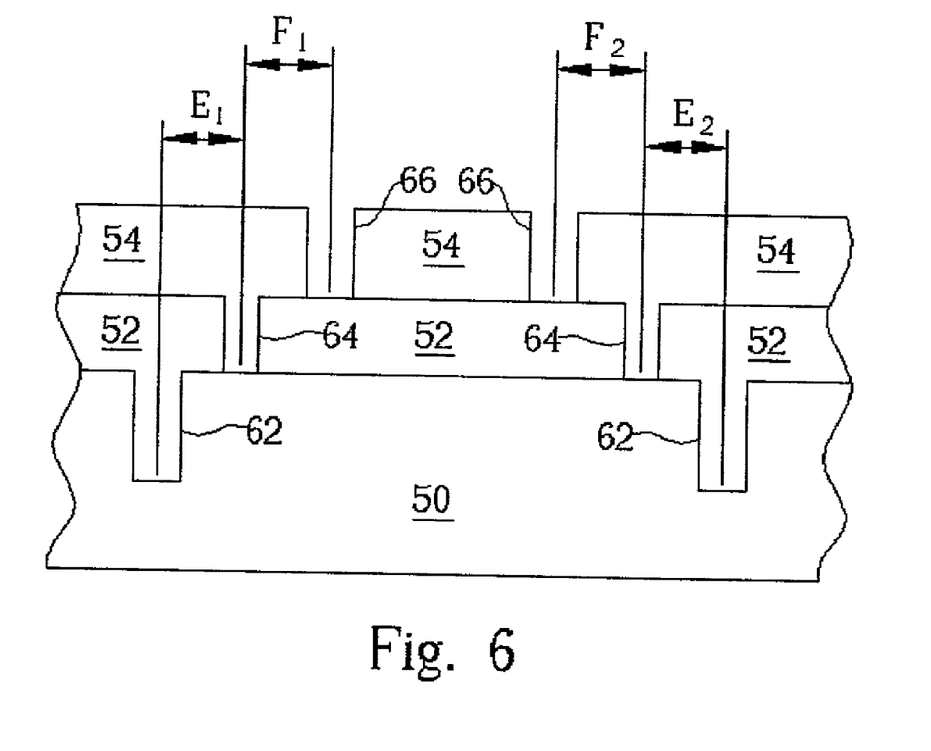
FIG. 6 shows a cross-sectional view of an overlay vernier pattern along line 3A–3A" of the top view in FIG. 5.

A second embodiment of an overlay vernier pattern of the present invention is illustrated in FIG. 5 and FIG. 6. In the second embodiment, a three-layer overlay vernier pattern 60 is shown. The overlay vernier pattern 60 includes a plurality of alignment marks 62 in a material layer 50, a plurality of alignment marks 64 in a material layer 52 over the material layer 50, and a plurality of alignment marks 66 in a material layer 54 over the material layer 52. The overlay vernier pattern 60 is similar to the overlay vernier pattern 40 of the first embodiment, except the alignment marks 66 in the top material layer 54 are recesses etched in the material layer 54.

When measuring alignment accuracy of the overlay vernier pattern 60, a distance $E_1$ between a midpoint of an alignment mark 62 and a midpoint of an alignment mark 64 adjacent to the alignment mark 62 is measured. A distance $E_2$ between a midpoint of another alignment mark 62 and a midpoint of an alignment mark 64 adjacent to this alignment mark 62 is also measured. Following this, the distances $E_1$ and $E_2$ are compared to each other, and a difference between the distances $E_1$ and $E_2$ is calculated, so as to get an alignment offset between the material layers 50 and 52.

Similarly, when measuring misalignment of the material layer 52 to the material layer 54, a distance $F_1$ between a midpoint of an alignment mark 64 and a midpoint of an alignment mark 66 adjacent to the alignment mark 64 is measured. A distance $F_2$ between a midpoint of another alignment mark 64 and a midpoint of an alignment mark 66 adjacent to this alignment mark 64 is also measured. Following this, the distances $F_1$ and $F_2$ are compared to each other, and a difference between the distances $F_1$ and $F_2$ is calculated, so as to get an alignment offset between the material layers 52 and 54.

Figure 7:
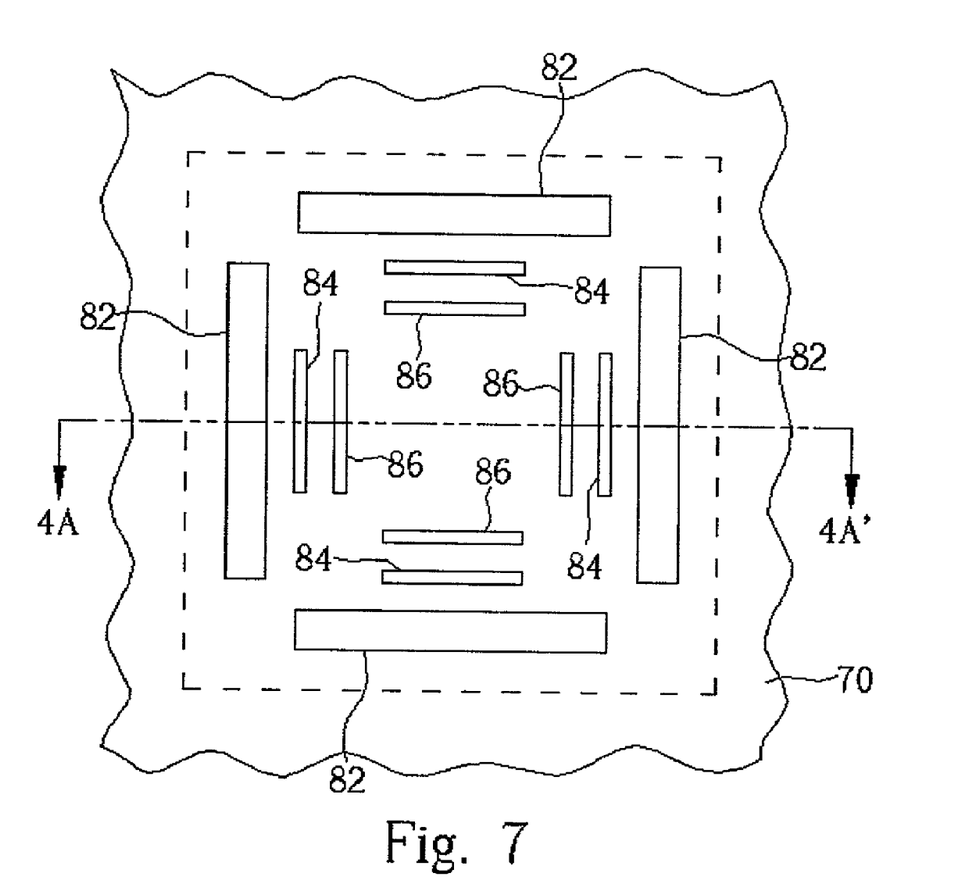
FIG. 7 shows a top view of an overlay vernier pattern for measuring multi-layer overlay alignment accuracy according to a third embodiment of the present invention.
Figure 8:
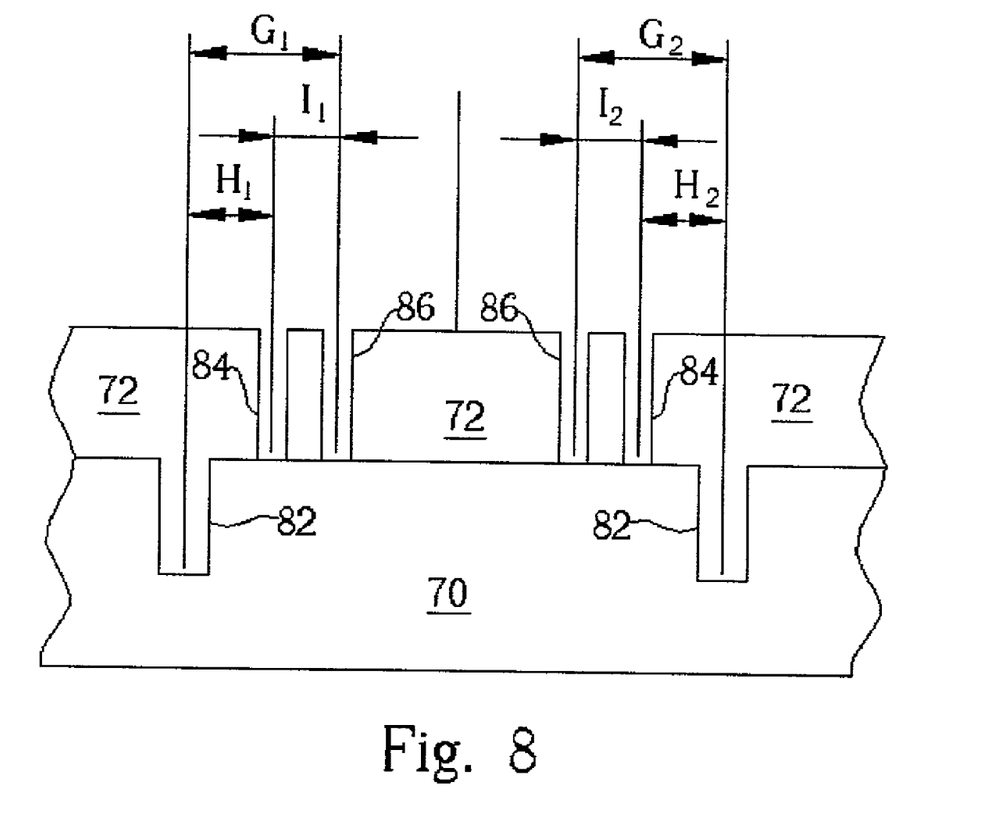
FIG. 8 shows a cross-sectional view of an overlay vernier pattern along line 4A–4A" of the top view in FIG. 7.

A third embodiment of an overlay vernier pattern of the present invention is illustrated in FIG. 7 and FIG. 8. In the third embodiment, a two-layer overlay vernier pattern 80 is shown. The overlay vernier pattern 80 includes a plurality of alignment marks 82 in a material layer 70 and a plurality of alignment marks 84 and 86 in a material layer 72 over the material layer 70. The alignment marks 82, 84 and 86 are formed in a scribe line of a test wafer and are symmetric to a center of the overlay vernier pattern 80. The material layer 70 can be a conductive layer, such as a polysilicon layer or a silicon substrate. Alternatively, the material layer 70 can be an insulating layer. The material layer 72 can be a developed photoresist layer. The alignment marks 82, 84, 86 are formed by positive photoresist or negative photoresist, having a pattern such as a recess buried in the material layers 70 and 72, or as a column protruded from an underlying material layer. Ideally, the alignment marks 82 are AEI trench structures formed by methods known by those versed in the art. The alignment marks 84 are ADI photoresist trench structures formed by a first photolithographic process. The alignment marks 86 are ADI photoresist trench structures formed by a second photolithographic process.

When measuring misalignment of the material layer 70 to the material layer 72 after the first photolithographic process is performed, a means consisting of an algorithm stored in a permanent memory is provided to measure a distance $H_1$ between a midpoint of an alignment mark 82 and a midpoint of an alignment mark 84 adjacent to the alignment mark 82. A distance $H_2$ between a midpoint of another alignment mark 82 and a midpoint of an alignment mark 84 adjacent to this alignment mark 82 is also measured. Following this, the distances $H_1$ and $H_2$ are compared to each other, and a difference between the distances $H_1$ and $H_2$ is calculated, so as to get an alignment offset between the material layers 70 and 72.

Similarly, when measuring misalignment of the material layer 70 to the material layer 72 after the second photolithographic process is performed, the same algorithm stored in the permanent memory is provided to measure a distance $G_1$ between a midpoint of an alignment mark 82 and a midpoint of an alignment mark 86 adjacent to the alignment mark 82. A distance $G_2$ between a midpoint of another alignment mark 82 and a midpoint of an alignment mark 86 adjacent to this alignment mark 82 is also measured. Following this, the distances $G_1$ and $G_2$ are compared to each other, and a difference between the distances $G_1$ and $G_2$ is calculated, so as to get an alignment offset between the material layers 70 and 72.

In addition, the overlay vernier pattern 80 also provides a measure of misalignment between the alignment marks 84 formed by the first photolithographic process and the alignment marks 86 formed by the second photolithographic process.

When measuring misalignment of the alignment marks 84 to the alignment marks 86, a distance $I_1$ between a midpoint of an alignment mark 84 and a midpoint of an alignment mark 86 adjacent to the alignment mark 84 is measured. A distance $I_2$ between a midpoint of another alignment mark 84 and a midpoint of an alignment mark 86 adjacent to this alignment mark 84 is also measured. Following this, the distances $I_1$ and $I_2$ are compared to each other, and a difference between the distances $I_1$ and $I_2$ is calculated, so as to get an alignment offset between the alignment marks 84 and 86.

According to the present invention, the alignment verniers for measuring the alignment accuracy between the material layer 70 and the material layer 72 after the first photolithographic process is performed, the alignment verniers for measuring the alignment accuracy between the material layer 70 and the material layer 72 after the second photolithographic process is performed, and the alignment verniers for measuring the alignment accuracy of the first photolithographic process and the second photolithographic process, can be formed in the same region of the scribe line. Specifically, the alignment marks 84 and 86 can be repeatedly used when measuring the alignment accuracy between the material layers 70 and 72, and measuring the alignment accuracy of the two photolithographic processes. Therefore, problems as waste of scribe line area and measuring time as happened in the prior art are effectively prevented in the present invention.

Figure 9:
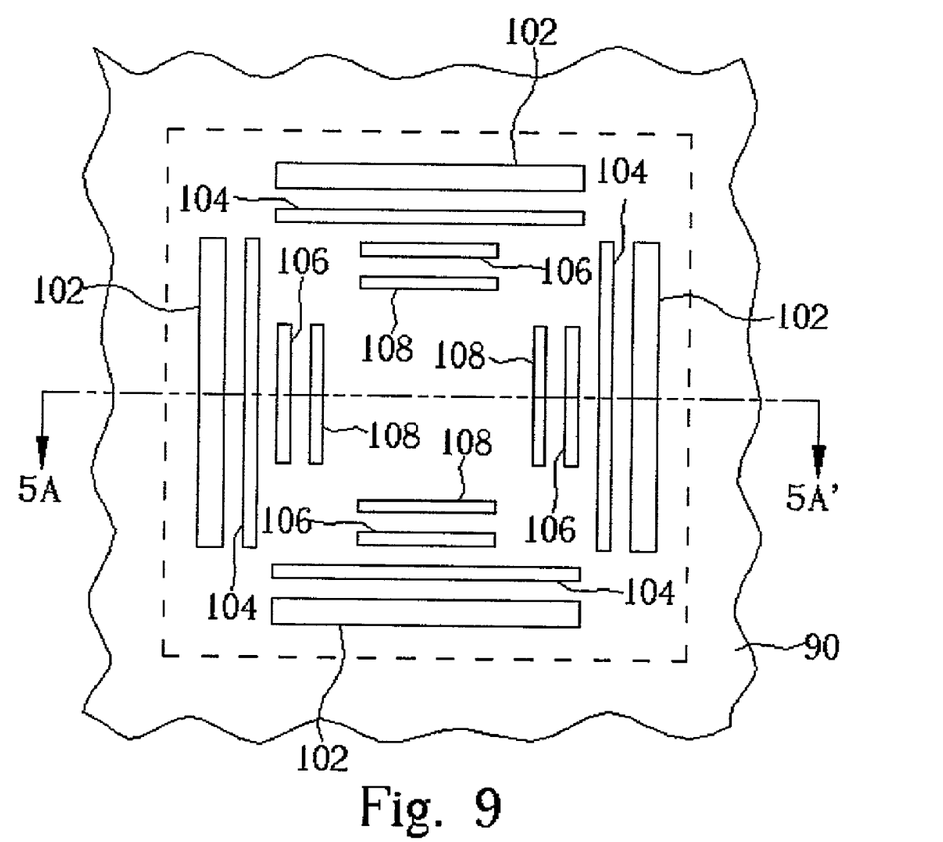
FIG. 9 shows a top view of an overlay vernier pattern for measuring multi-layer overlay alignment accuracy according to a fourth embodiment of the present invention.
Figure 10:
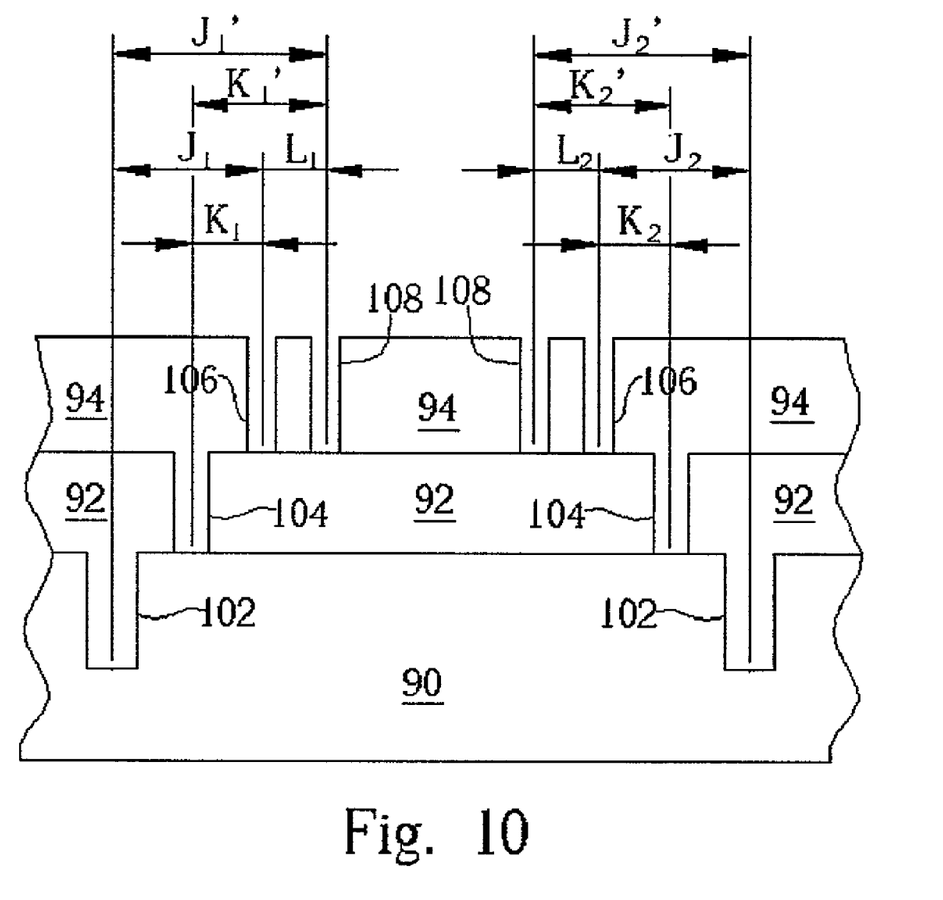
FIG. 10 shows a cross-sectional view of an overlay vernier pattern along line 5A–5A" of the top view in FIG. 9.

A fourth embodiment of an overlay vernier pattern of the present invention is illustrated in FIG. 9 and FIG. 10. In the fourth embodiment, a three-layer overlay vernier pattern 100 is shown. The overlay vernier pattern 100 includes a plurality of alignment marks 102 in a material layer 90, a plurality of alignment marks 104 in a material layer 92 over the material layer 50, and a plurality of alignment marks 106 and 108 in a material layer 94 over the material layer 92. The material layer 90 is similar to the material layer 70 to be a conductive layer or an insulating layer, and the material layer 94 is similar to the material layer 72 to be a developed photoresist layer. A difference between the overlay vernier pattern 80 and 100 is that the material layer 92 is inserted between the material layers 90 and 94. The material layer 92 can be either a conductive layer or an insulating layer.

Ideally, the alignment marks 102 and 104 are AEI trench structures formed by methods known by those versed in the art. The alignment marks 106 are ADI photoresist trench structures formed by a first photolithographic process. The alignment marks 108 are ADI photoresist trench structures formed by a second photolithographic process.

When measuring misalignment of the material layer 90 to the material layer 94 after the first photolithographic process is performed, a distance $J_1$ between a midpoint of an alignment mark 102 and a midpoint of an alignment mark 106 adjacent to the alignment mark 102 is measured. A distance $J_2$ between a midpoint of another alignment mark 102 and a midpoint of an alignment mark 106 adjacent to this alignment mark 102 is also measured. Following this, the distances $J_1$ and $J_2$ are compared to each other, and a difference between the distances $J_1$ and $J_2$ is calculated, so as to get an alignment offset between the material layers 90 and 94.

Similarly, when measuring misalignment of the material layer 90 to the material layer 94 after the second photolithographic process is performed, a distance $J_1''$ between a midpoint of an alignment mark 102 and a midpoint of an alignment mark 108 adjacent to the alignment mark 102 is measured. A distance $J_2''$ between a midpoint of another alignment mark 102 and a midpoint of an alignment mark 108 adjacent to this alignment mark 102 is also measured. Following this, the distances $J_1''$ and $J_2''$ are compared to each other, and a difference between the distances $J_1''$ and $J_2''$ is calculated, so as to get an alignment offset between the material layers 90 and 94.

$K_1$ and $K_2$ are measured to get an alignment offset between the material layers 92 and 94 after the first photolithographic process is performed. $K_1''$ and $K_2''$ are measured to get an alignment offset between the material layers 92 and 94 after the second photolithographic process is performed. In addition, $L_1$ and $L_2$ are measured to get an alignment offset between the alignment marks 106 formed by the first photolithographic process and the alignment marks 108 formed by the second photolithographic process.

In contrast to the prior art, the present invention forms alignment marks in each of the material layers in a region of the substrate. Therefore, layer-to-layer alignment accuracy measurement for any two of the material layers of the multi-layer structure can be simultaneously performed in the same region, so as to save a scribe line area and measuring time to increase the production throughput.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An overlay vernier pattern for measuring multi-layer overlay alignment accuracy of a substrate, the substrate comprising a first material layer, a second material layer over the first material layer, and a third material layer over the second material layer, the overlay vernier pattern comprising:

a plurality of first alignment marks positioned in the first material layer;

a plurality of second alignment marks positioned in the second material layer; and a plurality of third alignment marks positioned in the third material layer;

wherein a distance between a first alignment mark and a third alignment mark is compared with another distance between an adjacent first alignment mark and an adjacent third alignment mark to perform a measure of misalignment of the first material layer to the third material layer, and a distance between the third alignment mark and a second alignment mark is compared with another distance between an adjacent third alignment mark and an adjacent second alignment mark to perform a measure of misalignment of the third material layer to the second material layer.

2. The overlay vernier pattern of claim 1 wherein the distance between a first alignment mark and a third alignment mark refers to a distance ranging from a midpoint of the first alignment mark to a midpoint of the third alignment mark.

3. The overlay vernier pattern of claim 1 wherein the distance between the third alignment mark and a second alignment mark refers to a distance ranging from a midpoint of the third alignment mark to a midpoint of the second alignment mark.

4. The overlay vernier pattern of claim 1 wherein when measuring misalignment between the first material layer and the third material layer, and a difference between these two distances which are respectively measured from two first alignment marks to two third alignment marks refers to an offset value for aligning the first material layer to the third material layer.

5. The overlay vernier pattern of claim 1 wherein when measuring misalignment between the third material layer and the second material layer, and a difference between these two distances which are respectively measured from two third alignment marks to two second alignment marks refers to an offset value for aligning the third material layer to the second material layer.

6. The overlay vernier pattern of claim 1 wherein a pattern of the first alignment marks and the second alignment marks is formed by positive photoresist.

7. The overlay vernier pattern of claim 1 wherein a pattern of the first alignment marks and the second alignment marks is formed by negative photoresist.

8. The overlay vernier pattern of claim 1 wherein the first material layer and the second material layer comprise polysilicon.

9. The overlay vernier pattern of claim 1 wherein the first material layer is a semiconductor substrate.

10. The overlay vernier pattern of claim 1 wherein the third material layer comprises a developed photoresist layer.

11. A method for measuring patterned multi-layer overlay alignment accuracy (AA) comprising:
providing a semiconductor substrate, the semiconductor substrate comprising a patterned first material layer, a patterned second material layer, and a patterned third material layer positioned on a surface of the semiconductor substrate, respectively, the first material layer comprising a plurality of first alignment marks, the second material layer comprising a plurality of second alignment marks, and the third material layer comprising a plurality of third alignment marks; and
providing a means consisting of an algorithm stored in permanent memory for measuring misalignment between a first alignment mark and a third alignment mark, and measuring misalignment between the third alignment mark and a second alignment mark;
wherein a method for measuring misalignment between the first alignment mark and the third alignment mark comprises measuring a distance between a midpoint of the first alignment mark and a midpoint of the third alignment mark, and comparing this distance with another distance between an adjacent first alignment mark and an adjacent third alignment mark, and a difference between these two distances refers to an offset value for aligning the first material layer to the third material layer, a method for measuring misalignment between the third alignment mark and the second alignment mark comprises measuring a distance between a midpoint of the third alignment mark and a midpoint of the second alignment mark, and comparing this distance with another distance between an adjacent third alignment mark and an adjacent second alignment mark, and a difference between these two distances refers to an offset value for aligning the third material layer to the second material layer.

12. The method of claim 11 wherein a pattern of the first alignment marks and the second alignment marks is formed by positive photoresist.

13. The method of claim 11 wherein a pattern of the first alignment marks and the second alignment marks is formed by negative photoresist.

14. The method of claim 11 wherein the first material layer and the second material layer comprise polysilicon.

15. The method of claim 11 wherein the third material layer comprises a developed photoresist layer.

* * * * *